(12) United States Patent
Gold

(10) Patent No.: US 6,445,640 B1
(45) Date of Patent: Sep. 3, 2002

(54) METHOD AND APPARATUS FOR INVALIDATING MEMORY ARRAY WRITE OPERATIONS

(75) Inventor: Spencer Gold, Pepperell, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/816,890

(22) Filed: Mar. 23, 2001

(51) Int. Cl.$^7$ ................................................ G11C 8/00
(52) U.S. Cl. ................................... 365/230.06; 365/195
(58) Field of Search ............................... 365/230.06, 195

(56) References Cited

U.S. PATENT DOCUMENTS 5,642,316 A * 6/1997 Tran et al. ................... 365/200

FOREIGN PATENT DOCUMENTS

JP 0041579 * 4/1981 ............ G11C/8/00

OTHER PUBLICATIONS

Betty Prince, "Semiconductor Memories", 1983, Wiley, $2^{nd}$ edition pp. 160–161.*

* cited by examiner

Primary Examiner—M. Tran
(74) Attorney, Agent, or Firm—Lahive & Cockfield, LLP

(57) ABSTRACT

An electronic device that invalidates a memory write operation before a memory address predecode occurs. The electronic device uses several dynamic latches to assert complementary clock like memory address data to drive the associated predecode circuitry. A stack of serially connected transistors is coupled to the input node of each dynamic latch to provide input node state control. By managing the operation of each stack of serially connected transistors, the dynamic latches may be prevented from asserting their complementary clock like memory address data to the associated predecode circuitry in order to invalidate a memory write operation.

21 Claims, 5 Drawing Sheets

METHOD AND APPARATUS FOR INVALIDATING MEMORY ARRAY WRITE OPERATIONS

TECHNICAL FIELD OF THE INVENTION

The present invention generally relates to semiconductor devices and more particularly, to a semiconductor memory device having an addressable memory.

BACKGROUND OF THE INVENTION

In order to prevent writing of unwanted data into a memory array, it is often necessary to prevent or invalidate a memory write operation. Without a timely memory write invalidation, data integrity becomes an issue, because unwanted data may be written into the memory array at the risk of corrupting valid stored data. Situations in which a timely write invalidation is useful include circumstances when valid data and/or a valid data address are not available, or where a microprocessor is in a test mode.

The conventional implementation of a memory array write invalidation is accomplished at the expense of an increase in component density, an increase in memory array power consumption, and added delay in certain memory operations. The classic implementation of a write invalidation is to provide circuitry to directly cancel each write word line asserted. This can be accomplished with a control signal that is tied to each row decoder of the memory array. Another classic write invalidation technique is to allow the write word lines to assert, but to directly invalidate the data being written. Because memory density, device power dissipation, and device operating speeds are at a premium in today's marketplace, the inefficiencies of the conventional write invalidation techniques are an undue burden on a memory array architecture.

SUMMARY OF THE INVENTION

The present invention addresses the above-described limitations of conventional systems that facilitate memory array write invalidation operations. The present invention provides an approach to enable a memory write invalidation operation to occur outside of the memory array before a memory write word line is asserted.

In one embodiment of the present invention, an apparatus provides a decoding circuit that performs row predecoding and word line assertion. The predecode circuit invalidates a memory row predecode operation before the predecode operation occurs. In the predecode circuit, one or more switches are adapted to receive a write control signal. When the switches receive a control signal to invalidate a write operation, the write row predecoder is prevented from asserting. Further, the apparatus provides a row decode circuit to generate a write word line when a valid control signal is asserted at the switches.

The above described approach benefits a semiconductor device having an addressable memory array because the memory write invalidation occurs before any write row predecode lines are asserted. As a result, a memory device may have a reduced die area because an additional input at each row decoder in the memory array is no longer needed to invalidate a memory write operation.

In accordance with another aspect of the present invention, a method is performed in a storage device having addressable rows such that a memory write operation is invalidated before a write row predecode operation occurs. The storage device receives a memory row address at one or more dynamic input nodes to initiate the generation of a write word line. So long as a valid write control signal is asserted at the dynamic input nodes, a valid write word line is asserted to the storage device. A dynamic latch is coupled to the dynamic input node. Should the valid write control signal be deasserted at the dynamic input nodes, the dynamic latch latches are reset, which, in turn, prevents any of the row predecode inputs from asserting, and, in turn, prevents any write word line from asserting.

The above-described approach benefits a microprocessor architecture that processes speculative data in that unwanted data is prevented from being written into the memory array before a memory write predecode occurs; thus, there is a minimal impact on the processing time of the microprocessor. As a result, microprocessor processing efficiency is increased and power consumption is decreased.

Moreover, the placement of a level sensitive latching device before any of the row decoding circuitry allows the memory row address to be held constant at the inputs of the row decoding circuitry for an entire clock phase. In this manner, the memory row decode operation may occur for an entire clock phase without having the memory row address, at the input to the memory row decoder, change before the decode operation is complete.

BRIEF DESCRIPTION OF THE DRAWINGS

An illustrative embodiment of the present invention will be described below relative to the following drawings.

DETAILED DESCRIPTION OF AN ILLUSTRATIVE EMBODIMENT

The illustrative embodiment of the present invention provides a semiconductor device for increasing the efficiency of performing a memory write invalidation. In the illustrative embodiment, a predecode circuit is adapted to have a switch in circuit with each of its dynamic input nodes. Each of these switches is adapted to respond to a write control signal. The write control signal is asserted to indicate that valid data needs to be written to memory, and that a memory write address should be generated. Conversely, when the write control signal is deasserted, the deassertion indicates invalid data that should not be written to memory and that a memory address should not be generated. The deassertion of the write control signal at the switches prevents the dynamic input nodes from asserting a write row address signal to the write row predecoders in the predecoder circuit, which, in turn, prevents the generation of a write word line.

The switches in the predecode circuit are adapted to each be one transistor in a stack of serially connected transistors. The serially connected transistors form a pull down stack capable of pulling the input node of a dynamic latch to a logic "0" level when the write control signal is asserted. Because the deassertion of the write control signal causes the input of the dynamic latch to be held at a logic "1" level during the latch's evaluate phase, the dynamic latch can be prevented from asserting a write row address to any of the write row predecoders. The configuration of the serially connected transistors at each dynamic input node can prevent any unnecessary write row predecodes and, as such, invalidate a memory array write operation.

In the illustrative embodiment, the apparatus is attractive for use in microprocessors that process speculative data, or microprocessors that utilize scan testing. This apparatus allows a memory write to be invalidated with a minimum of processing delay, which can result in an increase in the number of instructions the microprocessor may process in a given time period. Additionally, the illustrative embodiment reduces power drawn from the power supplies, reduces power dissipation of the apparatus, and allows a memory device to have more memory cells.

Figure 1:
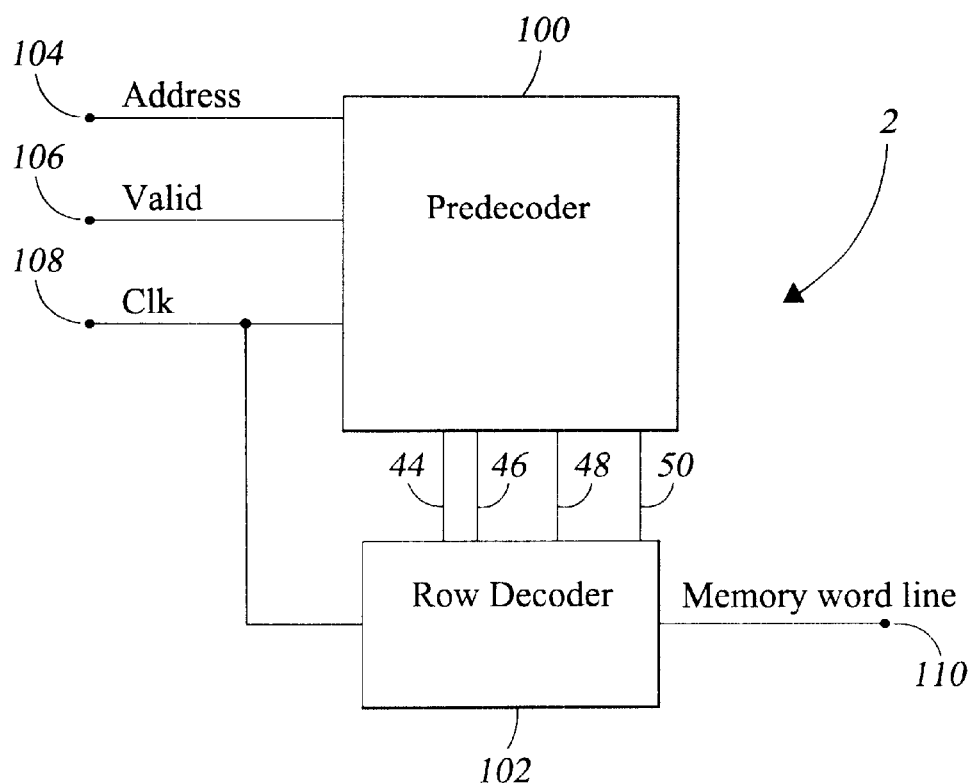
FIG. 1 depicts a block diagram of an apparatus suitable for practicing the illustrative embodiment of the invention.

FIG. 1 is a block diagram of an exemplary circuit 2 that is suitable for the illustrative embodiment of the present invention. The exemplary circuit 2 has an input node 104 for receiving a write memory address and a write control input node 106 for receiving a write control signal to indicate a valid or an invalid memory write operation. A clock pulse enters at input node 108 and provides the necessary clock pulse to the predecoder 100 and the row decoder 102. The predecoder 100 provides one or more switches in circuit with the write control input node 106. The switches allow the row address at the input node 104 to be asserted to the write row predecoders of the predecoder 100 when the write control signal at the write control input node 106 indicates a valid write operation. A valid write control signal at the write control input node 106 allows the predecoder 100 to assert a partially decoded memory address at its output nodes, namely, node 44, node 46, node 48, and node 50. The row decoder 102 receives the partially decoded memory address from the predecoder 100 and, in turn, asserts a valid write word line to the memory device at the output node 110. By contrast, when the write control signal at the write control input node 106 is deasserted, the predecoder 100 is prevented from asserting a write row predecode at its output nodes, namely node 44, node 46, node 48, and node 50, and, thus, prevents the row decoder 102 from asserting a memory word line on the output node 110.

Those skilled in the art will appreciate that the depiction of the predecoder 100 and the row decoder 102 in FIG. 1 is intended to be merely illustrative and not limiting of the present invention. The illustrative embodiment of the present invention presumes an 2 bit row addressing scheme in the memory device; however, the memory device may have a 4 bit row addressing scheme or a row addressing scheme with significantly more bits (e.g., 8, 16, 32, or 64) in some instances. As will be described in more detail below, predecoder 100 is presumed to have one or more dynamic input circuits that produce complementary address row data in a clock like manner.

The transistors depicted in FIGS. 2 through 5 are from the Metal Oxide Semiconductor Field Effect Transistors (MOSFET) family of transistors, which includes P-channel MOSFETs, (also referred to as NMOS transistors or PFETS), N-channel MOSFETs, (also referred to as NMOS transistors or NFETS,) and complementary symmetry MOSFETs, (also referred to as CMOS transistors). In addition, those skilled in the art will appreciate that the present invention may be practiced with the predecoder 100 as a memory read row predecoder circuit or as a memory write row predecoder circuit.

Figure 2:
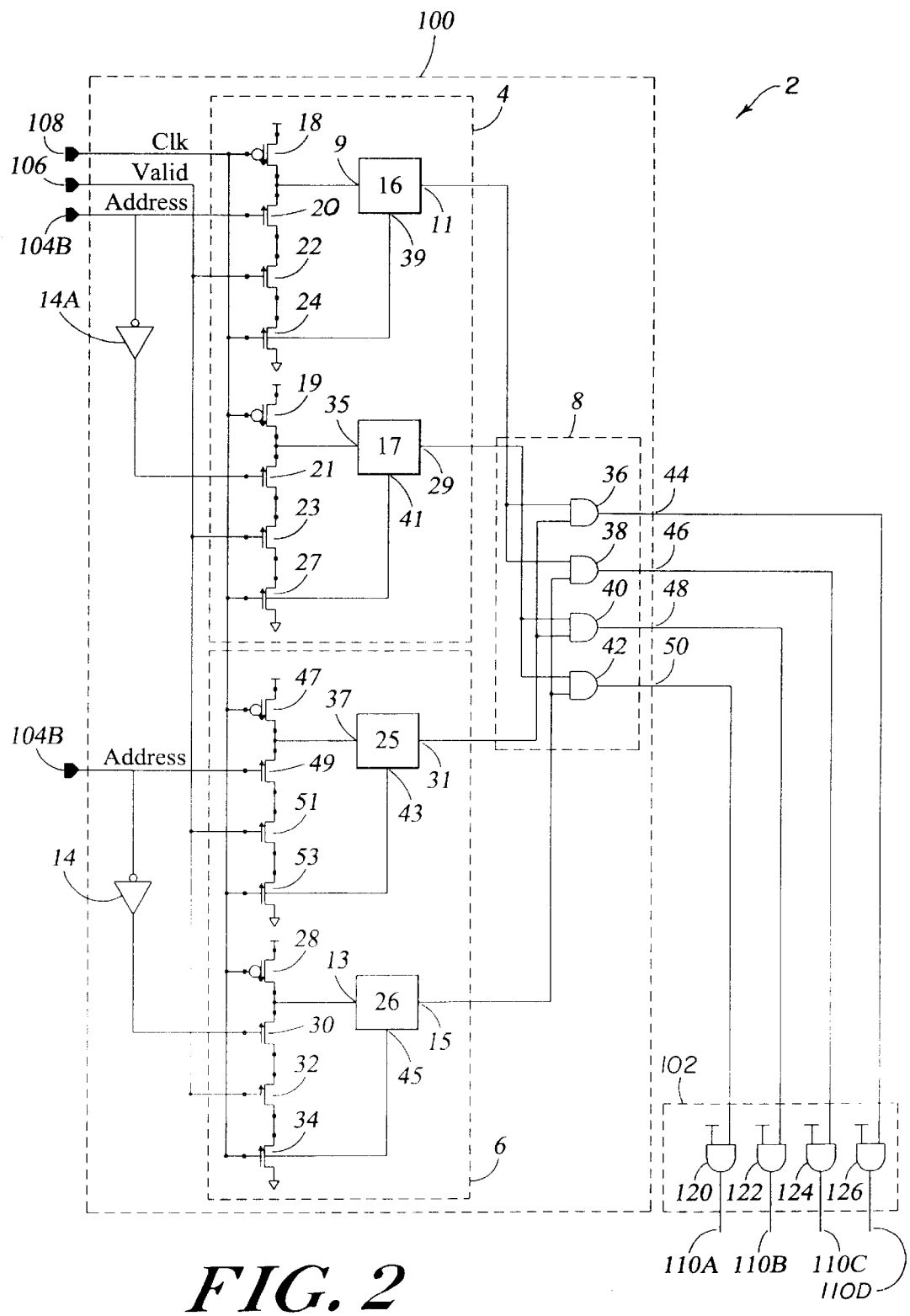
FIG. 2 depicts an electrical circuit that is suitable for implementing the write invalidation technique of the illustrative embodiment.

With reference to FIGS. 1 and 2, an apparatus suitable for preventing a write word line from being asserted when a write control signal is deasserted, is illustrated by FIG. 2. The exemplary circuit 2 includes the clock input node 108, the write control signal input node 106, the write memory address input node 104, and the memory write line output node 110 as described above relative to FIG. 1. The input node 108 is adapted to receive the clock signal necessary to precharge any dynamic logic components of the predecoder 100, and to synchronize the operation of the various components and circuits of the predecoder 100 and the row decoder 102.

The predecoder 100 is adapted to have a first dynamic input circuit 4 and a second dynamic input circuit 6 that control assertion and deassertion of the memory row address data. to the input nodes of the predecode circuit 8. For ease of discussion, the operation of the predecoder 100 will be discussed below with reference to a 2 bit addressing scheme. One skilled in the art will recognize that the predecoder 100 may be expanded upon in support of other addressing schemes, including but not limited to a 4 bit addressing scheme, an 8 bit addressing scheme, a 16 bit addressing scheme, or a 32 bit addressing scheme. Hence, those skilled in the art will appreciate that the depiction of the exemplary circuit 2 depicted in FIG. 2 is intended to be merely illustrative and not limiting of the present invention.

In operation, when a valid write control signal is asserted at the write control input node 106 of the exemplary circuit 2, the dynamic input circuit 6 generates complementary memory address data for the "zero" address bit, in a clock-like fashion. In like manner, the dynamic input circuit 4 generates complementary memory address data for the "one" address bit in a clock like fashion. The complementary memory address data asserted by the dynamic input circuit 4 and the dynamic input circuit 6 together drive the predecode circuitry of the predecode circuit 8.

So long as the dynamic input circuit 4 and the dynamic input circuit 6 assert valid data, the predecode circuit 8 generates a memory predecode that helps expedite the row decoding operation. The predecoded memory write address asserted by the predecode circuit 8 at nodes 44, 46, 48, and 50, drives the row decoder circuit 102. The memory predecode generated by the predecode circuit 8 simplifies the memory word line decode by providing a partially decoded memory word address that allows the row decoder 102 to generate the corresponding memory word line in a more efficient manner.

To invalidate a memory write operation, the write control signal at the write control input node 106 is deasserted, which prevents the dynamic input circuit 4 and the dynamic input circuit 6 from asserting their complementary memory address data to predecode circuit 8, which in turn, prevents the predecode circuit 8 from asserting the memory predecode signals to the row decoder 102, and hence, prevents the row decoder 102 from asserting a memory word line at the output node 110. Those skilled in the art will appreciate that the deassertion of the write valid signal at the write control input node 106 causes each input to the predecode circuit 8 to be forced to a logic level "0", which prevents the assertion of a memory word line.

The dynamic input circuit 4 is adapted to have two dynamic input nodes, dynamic node 9 and dynamic node 35. The use of two dynamic input nodes in the dynamic input circuit 4, of the exemplary circuit 2, allow the dynamic input circuit 4 to store each address bit and its complement. Consequently, the storage of the address bit and its complement help to reduce memory access time by simplifying the memory decode operation. One skilled in the art will recognize that the dynamic input circuit 4 may be adapted to operate using only a single dynamic input node. Alternatively, the dynamic input circuit 4 may be modified to have a dynamic input node for each bit in a memory address or may be modified to have a dynamic input node for one or more subsets of address bits.

The dynamic input circuit 4 includes a first dynamic latch 16 that has its input in circuit with the dynamic node 9 and a second dynamic latch 17 that has its input in circuit with the dynamic node 35. In the illustrative example of FIG. 2, the first dynamic latch 16 and the second dynamic latch 17 are both dynamic glitch latches that operate in the following manner. When the clock signal at the input node 108 is at a logic "1" level, the dynamic latch 16 and the dynamic latch 17 are in their evaluate phase. When the clock signal at the input node 108 is at its logic "0" level, the dynamic latch 16 and the dynamic latch 17 are closed or latched.

The dynamic latch 16 is level sensitive, and not edge sensitive. During the evaluate phase of the dynamic latch 16, the latch evaluates the data on the dynamic node 9 and asserts a corresponding output at the output node 11. When the dynamic latch 16 closes, the dynamic node 9 is pre-charged to a logic "1" level. If during the start of the dynamic latch's 16 evaluate phase, the output node 11 is at a logic "1" level, the output node 11 transitions to a logic "0" level. If during the dynamic latch's 16 evaluate phase, the dynamic node 9 transitions from a logic "1" level to a logic "0" level, the output node 11 rises to a logic "1" level; otherwise, output node 11 remains at a logic "0" level. The dynamic latch 16 will be recognized by one skilled in the art to be an "A phase dynamic latch" because it evaluates during the A phase of the clock, that is, when the clock is at a high logic level, and is latched in the B phase of the clock, that is, when the clock is at a low logic level.

The dynamic node 9 is adapted to have a dynamic latch 16 in circuit with the serially connected transistors 18, 20, 22, and 24, as illustrated in FIG. 2. The PMOS transistor 18 is in serial connection with NMOS transistors 20, 22, and 24, and together they operate to control the state of the dynamic node 9. The PMOS transistor 18 has its source tied to a voltage source supplying a high level voltage signal, its gate in circuit with the input node 108 and its drain in circuit with the drain of NMOS transistor 20 and the dynamic node 9. The PMOS transistor 18 operates as a precharge transistor that precharges dynamic node 9 to a logic "1" level when the clock at the input node 108 is at a logic "0" level. The NMOS transistor 20 has its gate in circuit with the address input node 104B and its source in circuit with the drain of NMOS transistor 22. The NMOS transistor 22 has its gate coupled to the write control input node 106 while having its source coupled to the drain of NMOS transistor 24. The NMOS transistor 24 has its gate tied to the input node 108 and its source tied to ground. Those skilled in the art will recognize that the stack ordering of serially connected transistors 20, 22, and 24 is illustrative and that serially connected transistors 20, 22, and 24 may be interchanged without departing from the scope of the present invention.

The dynamic latch 16 is an A phase dynamic glitch latch, and will be discussed in more detail below. One skilled in the art will appreciate that the dynamic latch 16 may be a dynamic latch selected from the family of A phase dynamic glitch latches or from the family of A phase dynamic jam latches. Moreover, the dynamic latch 16 may be configured to operate as a B phase dynamic latch selected from the family of B phase dynamic glitch latches or alternatively, selected from the family of B phase dynamic jam latches.

In similar fashion, the dynamic latch 17 is level sensitive, and not edge sensitive. During the evaluate phase of the dynamic latch 17, the latch evaluates the data on the input node 35 and asserts a corresponding output on the output node 29. When the dynamic latch 17 closes, input node 17 is pre-charged to a logic "1" level. If during the start of the dynamic latch's 17 evaluate phase, the output node 29 is at a logic "1" level, the output node 29 transitions to a logic "0" level. If during the dynamic latch's 17 evaluate phase, the dynamic node 35 transitions from a logic "1" level to a logic "0" level, the output node 29 rises to a logic "1" level; otherwise the output node 29 remains at a logic "0" level. The dynamic latch 17 will be recognized by one skilled in the art to be an A phase dynamic latch because it evaluates during the A phase of the clock, that is, when the clock is at a high logic level, and is latched in the B phase of the clock, that is, when the clock is at a low logic level.

The dynamic node 35 is adapted to have the dynamic latch 17 in circuit with the serially connected transistors 19, 21, 23, and 27, as depicted in FIG. 2. The PMOS transistor 19 in serial connection with the NMOS transistors 21, 23, and 27, operate to control the state of the dynamic node 35. The PMOS transistor 19 has its source tied to a voltage source that supplies a high level voltage signal, its gate is in circuit with the input node 108 and its drain is in circuit with the drain of the NMOS transistor 21 and the dynamic node 35. In operation, the PMOS transistor 19 acts as a precharge transistor that precharges the dynamic node 35 to a logic "1" level when the clock at input node 108 is at a logic "0" level. The NMOS transistor 21 has its gate in circuit with the output of inverter 14A. The inverter 14A has its input in circuit with the address input node 104B to provide the complement of the address bit. The NMOS transistor 21 has its source in circuit with the drain of the NMOS transistor 23. The NMOS transistor 23 has its gate coupled to the write control input node 106 while having its source coupled to the drain of NMOS transistor 27. The NMOS transistor 27 has its gate tied to the input node 108 and its source tied to ground. Because the complementing of the address bit by inverter 14A causes a slight propagation delay, the dynamic input circuit 4 produces clock like complementary address to help drive the predecode circuit 8. Those skilled in the art will recognize. that the stack ordering of serially connected transistors 21, 23, and 27 is illustrative and that serially connected transistors 21, 23, and 27 may be interchanged without departing from the scope of the present invention.

The dynamic latch 17 is an A phase dynamic glitch latch, which will be discussed in more detail below. One skilled in the art will appreciate that the dynamic latch 17 may be a dynamic latch selected from the family of A phase dynamic glitch latches or from the family of A phase dynamic jam latches. Moreover, the dynamic latch 17 may be configured to operate as a B phase dynamic latch selected from the family of B phase dynamic glitch latches or alternatively, configured to operate as a B phase dynamic latch selected from the family of B phase dynamic jam latches.

The dynamic input circuit 6 is adapted to have two dynamic input nodes, the dynamic node 13 and the dynamic node 37. The use of two dynamic input nodes in the dynamic input circuit 6, of the exemplary circuit 2, allows the memory address bit assigned to the dynamic input circuit 6 be complemented to help reduce memory access time by simplifying the memory decode operation. One skilled in the art will recognize that the dynamic input circuit 6 may be adapted to operate using only a single dynamic input node. Alternatively, the dynamic circuit 6 may be modified to have a dynamic input node for each bit in the memory address or may be modified to have a dynamic input node for one or more subsets of address bits.

The dynamic input node 37 is configured to have the input of the dynamic latch 25 in circuit with the serially connected transistors 47, 49, 51, and 53, as exemplified by FIG. 2. The PMOS transistor 47 in serial connection with the NMOS transistors 49, 51, and 53 operate to control the state of the dynamic node 37. The PMOS transistor 47 has its source tied to a voltage source supplying a high level voltage signal, its gate in circuit with the input node 108 and its drain in circuit with the drain of the NMOS transistor 49 and the dynamic node 37. The PMOS transistor 47 operates to precharge the dynamic node 37 to a logic "1" level when the clock signal at the input node 108 is at a logic "0" level and the dynamic latch 25 is closed. The NMOS transistor 49 has its gate in circuit with the input node 104A and its source in circuit with the drain of the NMOS transistor 51. The NMOS transistor 51 has its gate coupled to the write control input node 106 while having its source coupled to the drain of the NMOS transistor 53. The NMOS transistor 53 has its gate tied to the input node 108 and its source tied to ground. Those skilled in the art will recognize that the stack ordering of serially connected transistors 49, 51, and 53 is illustrative and that serially connected transistors 49, 51, and 53 may be interchanged without departing from the scope of the present invention.

The dynamic latch 25 is an A phase dynamic glitch latch that has its input in circuit with the dynamic node 37, its output in circuit with the node 31 and its clock input in circuit with the input node 108. The details of the dynamic latch 25 will be discussed in more detail below. One skilled in the art will appreciate that the dynamic latch 25 may be a dynamic latch selected from the family of A phase dynamic glitch latches or from the family of A phase jam dynamic latches. Moreover, the dynamic latch 25 may be configured to operate as a B phase dynamic latch from the family of B phase dynamic glitch latches or configured to operate as a B phase dynamic latch from the family of B phase dynamic jam latches.

In similar fashion, the dynamic node 13 is adapted to have a dynamic latch 26 in circuit with the serially connected transistors 28, 30, 32, and 34, as shown in FIG. 2. The PMOS transistor 28 in serial connection with the NMOS transistors 30, 32, and 34, operate to control the state of the dynamic node 13. The PMOS transistor 28 has its source tied to a voltage source supplying a high level logic signal, its gate in circuit with the input node 108 and its drain in circuit with the drain of the NMOS transistor 30 and the dynamic node 13. The PMOS transistor 28 precharges the dynamic node 13 to a logic "1" level when the clock signal at the input node 108 is at a logic "0" level and the dynamic latch 26 is closed. The NMOS transistor 30 has its gate in circuit with the output of the inverter 14, and its source in circuit with the drain of the NMOS transistor 32. The inverter 14 has its output coupled to the input node 104A. The NMOS transistor 32 has its gate coupled to the write control input node 106 while having its source coupled to the drain of the NMOS transistor 34. NMOS transistor 34 has its gate tied to the input node 108 and its source tied to ground. Because the complementing of the address bit by inverter 14 causes a slight propagation delay, the dynamic input circuit 6, like the dynamic input circuit 4, produces clock-like complementary address data to drive the predecode circuit 8. Those skilled in the art will recognize that the stack ordering of serially connected transistors 30, 32, and 34 is illustrative and that serially connected transistors 30, 32, and 34 may be interchanged without departing from the scope of the present invention.

Dynamic latch 26 is an A phase dynamic glitch latch that has its input in circuit with the dynamic node 13, its output in circuit with the output node 15 and its clock input in circuit with the input node 108. The details of the dynamic latch 26 will be discussed in more detail below. One skilled in the art will appreciate that dynamic the latch 26 may be a dynamic latch selected from the family of dynamic A phase glitch latches or from the family of dynamic A phase jam latches. Moreover, the dynamic glitch latch 26 may be configured to operate as a dynamic B phase latch from the family of dynamic B phase glitch latches or configured to operate as a dynamic B phase latch from the family of dynamic B phase jam latches.

In further detail, the NMOS transistors 22, 23, 32, and 51 are the switches that operate to control the assertion and deassertion of memory address data to predecode circuit 8. The NMOS transistors 22, 23, 32, and 51 are adapted to operate based on positive logic so that a valid memory write operation is indicated by a logic "1" level at the write control input node 106 and an invalid memory write operation is indicated by a logic "0" level at the write control input node 106. One skilled in the art will appreciate that exemplary circuit 2 may be adapted to invalidate a memory write operation using inverse logic techniques.

As depicted by FIG. 2, the dynamic input nodes 9, 35, 37 and 13 are precharged to a known state, such as a logic "1" level, when the clock signal at the input node 108 is at a logic "0" level. The PMOS transistors 18, 19, 47 and 28, are able to pre-charge the dynamic input nodes 9, 35, 37 and 13 when the clock signal at the input node 108 is at a logic "0" level, because the dynamic latches 16, 17, 25 and 26, are closed or latched when the input node 108 is at a logic "0" level. One skilled in the art will recognize that the pre-charge operation may occur when the clock signal is at a logic "1" level and that the dynamic latches may be configured to be closed or latched when the clock at input node 108 is at a logic "1" level.

So long as the dynamic input nodes 9, 35, 37 and 13 can be pulled to ground and held there during the evaluate phase of the dynamic latches 16, 17, 25 and 26, the dynamic latches assert memory address data to the inputs of predecode circuit 8. However, if the dynamic input nodes 9, 35, 37 and 13 are prevented from being pulled down from a logic "1" level to a logic "0" level during the evaluate phase of the dynamic latches 16, 17, 25 and 26, the output nodes 11, 17, 25 and 26 assert a logic "0" level to prevent predecode circuit 8 from asserting a predecoded memory address.

In this manner, the write control transistors 22, 23, 51 and 32 enable each associated pull down stack of serially connected transistors to pull the dynamic input nodes 9, 35, 37 and 13 from a logic "1" level to a logic "0" level, during the evaluate phase of dynamic latches 16, 17, 25 and 26, when the write control signal is asserted at the write control input node 106. As a result, when the write control signal is deasserted at the gates of the transistors 22, 23, 51 and 32, the output nodes 11, 29, 31 and 15 transition to a logic "0" level to prevent the predecode circuit 8 from asserting.

The predecode circuit 8 utilizes four AND gates, AND gate 36, AND gate 38, AND gate 40, and AND gate 42, to perform the memory address predecode operation. The AND gate 36 is a two input AND gate having its first input in circuit with the output node 11, its second input tied to output node 31, and its output tied to the output node 44. The AND gate 38 is also a two input AND gate having its first input tied to the output node 11, its second input tied to the output node 15, and its output tied to the output node 46. The AND gate 40 like the AND 38 and the AND 36 is a two input AND gate having its first input in circuit with output node 29, its second input in circuit with the output node 31, and its output in circuit with the output node 48. The AND gate 42 like the other AND gates depicted in the exemplary circuit 2 is a two input AND gate having its first input in circuit with the output node 26, its second input in circuit with the output node 15, and its output in circuit with the output node 50. One skilled in the art will recognize the predecode logic circuit 8 can adapted to utilize all NAND gates, or all NOR gates, or a combination of each.

The predecode circuit 8 performs a partial memory row decode operation on the memory address data supplied by the dynamic input circuit 4 and the dynamic input circuit 6 to supply the memory row decode circuit 102 with a memory row address that is partially decoded. For example, the predecode circuit 8 is able to indicate to the row decode circuit 102 that the memory row of interest is located in the upper half portion of the addressable memory device, or in the lower half portion of the addressable memory device. This predecode technique advantageously expedites memory access by reducing the burden of full memory address decoding on the memory row decode circuit 102.

The predecode circuit 8 is adapted to have the AND gate 36 perform a logical AND operation on memory address bit 0 and memory address bit 1, asserted by the dynamic input circuit 6 and the dynamic input circuit 4. Similarly, AND gate 38, of the predecode circuit 8, performs a logical AND operation on the complemented memory address bit 0 asserted by the dynamic input circuit 6 and the complemented memory address bit 1 asserted by the dynamic input circuit 4. The AND gate 40 of the predecode circuit 8 performs a logical AND operation on the complemented memory address bit 1 asserted by the dynamic input circuit 4 and the memory address bit 0 asserted by the dynamic input circuit 6. Additionally, AND gate 42 performs a logical AND operation on the complemented memory address bit 0 asserted by the dynamic input circuit 4 and the complemented memory address bit 0 asserted by the dynamic input circuit 6.

Consequently, the AND style predecode circuit 8 controls a "1 hot" or "0 hot" positive logic predecode bus based on the outputs of the dynamic input circuit 4 and the dynamic input circuit 6. That is, the predecode circuit 8 using the memory address data asserted by the dynamic input circuit 4 and the dynamic input circuit 6 asserts a logic "1" level on one of its output nodes to enable a particular input of the decoder circuit 102. The predecode circuit 8 asserts a logic "0" level on the remainder of its output nodes to disable or deselect the other inputs of the decoder circuit 102. For example, the predecode circuit 8 will assert a logic "1" level on output node 44 if the memory address bit 0 and memory address bit 1 are both set to a logic "1" level and correspondingly asserts a logic "0" level on output nodes 46, 48, and 50 to deassert each nodes corresponding memory row decoder.

Those skilled in the art will appreciate that the logic level asserted by the predecode circuit 8 to select or enable a memory row decoder input is based upon the gate style selected to perform the predecode and decode operation. For example, should the predecode circuit 8 utilize NAND style logic gates and the decode circuit 102 utilizes NOR style logic gates, the predecode circuit 8 asserts a low "0" logic level to select or enable an input of the NOR style decode circuit 102.

The memory row decode circuit 102 coupled to the output nodes 44, 46, 48, and 50 of the predecoder 100 generates the memory word lines based on the output of the predecode circuit 8. The memory row decode circuit 102 includes a two input AND gate 120, a two input AND gate 122, a two input AND gate 124, and a two input AND gate 126. The memory row decode circuit 102 is illustrated with two input AND gates to illustrate the ability of the row decode circuit 102 to perform a memory row decode operation on a predecode bus that contains more than four bits. The additional memory row inputs that the row decode circuit 102 supports, allows the use of multiple predecode circuits to assert a particular row in the memory array. That is, the additional memory row inputs of the row decode circuit 102 can be tied to another "1" or "0" hot predecode bus if required. Those skilled in the art will recognize that the exemplary circuit 2 illustrates a four bit predecode bus, thus, the first input of the AND gate 120, the AND gate 122, the AND gate 124, and the AND gate 126 are tied to a voltage source supplying a high level voltage signal.

The AND gate 120 has its second input tied to node 50 and has its output tied to node 110A. The AND gate 122 has its second input tied to node 48 and its output tied to node 110B. In similar fashion, the AND gate 124 has its second input tied to node 46 and its output tied to node 110C. Similarly, the AND gate 126 has its second input tied to node 44 and its output tied to node 110D. Moreover, those skilled in the art will recognize that the memory row decode circuit 102 may be a NOR style row decoder that utilizes NOR gates to decode the memory address asserted by the predecode circuit 8.

Figure 3:
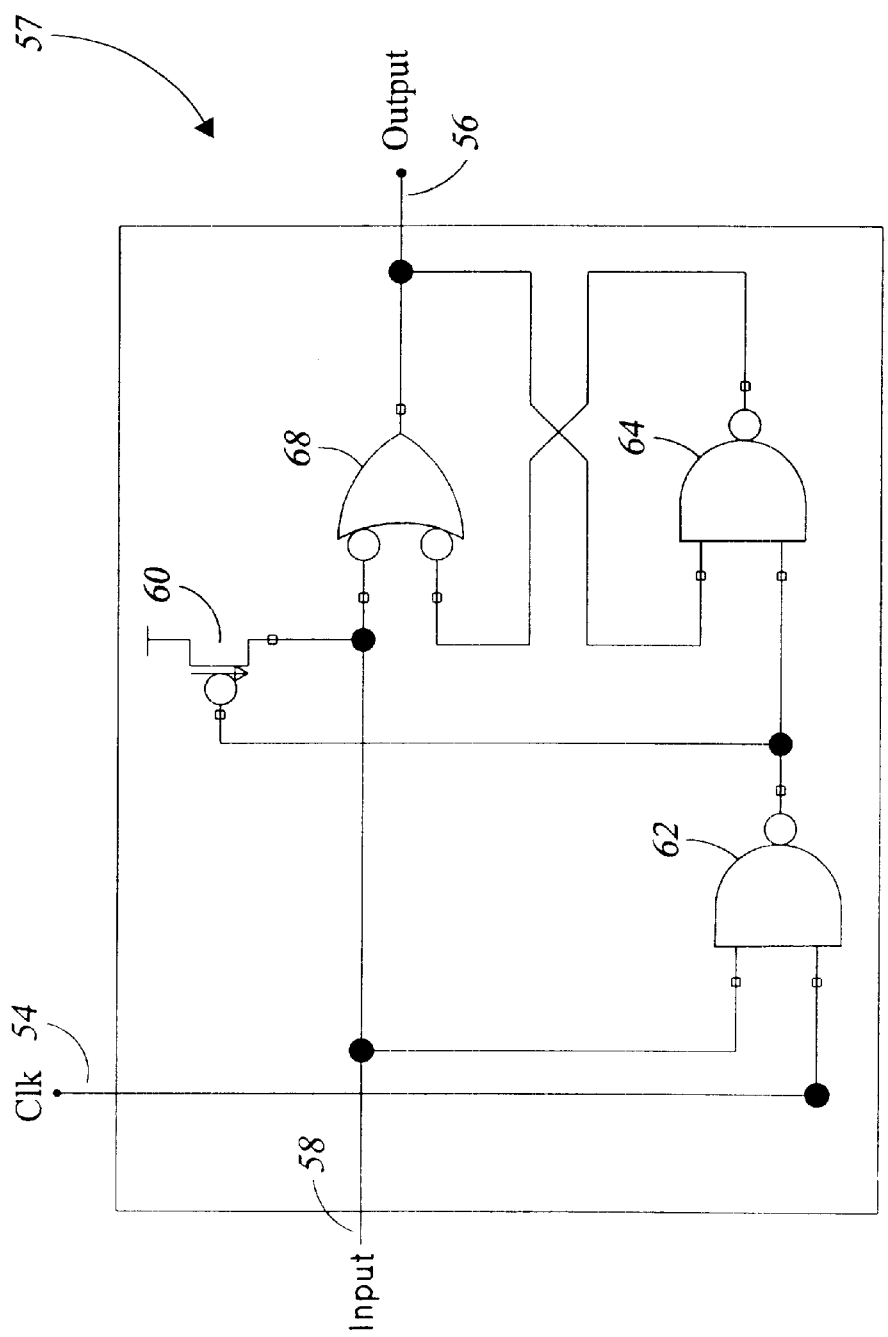
FIG. 3 depicts an A phase dynamic glitch latch in more detail.

FIG. 3 is a more detailed illustration of an A phase dynamic glitch latch 57 suitable for use as dynamic latch 16, 17, 25, or 26. Input node 58 is adapted for receiving data and is tied to the drain of PMOS transistor 60, a first input of NOR gate 8, and a first input of NAND gate 62. Dynamic glitch latch 57 is synchronized by a lock pulse at input node 54, which is also coupled to the second input of NAND gate 62. The output of NAND gate 62 is in circuit with the gate of PMOS transistor 60, and in circuit with the second input of NAND gate 64. PMOS transistor 60 has its source in circuit with a voltage source supplying a high level voltage signal. In operation, PMOS transistor 60 holds input node 58 at a logic "1" level when NAND gate 62 asserts a logic "0" level output. NOR gate 68 has its second input in circuit with the output node of NAND gate 64, its output in circuit with the first input of NAND gate 64, and in circuit with output node 56. One skilled in the art will. recognize that the PMOS transistor 60 operates as an optional keeper device and that the circuit configuration depicted by FIG. 3 may be adapted to operate and function without the PMOS transistor 60.

Dynamic latch 57 is referred to as an A phase dynamic glitch latch because it evaluates when the clock at input node 54 is at a logic "1" level, or the clock's A phase. Dynamic latch 57 is closed or latched, when the clock at input node 54 is at a logic "0" level, or the clock's B phase. In operation, input node 58 must be precharged to a logic "1" level when dynamic latch 57 is closed. When the clock at input node 54 reaches a logic "1" level and output node 56 is a logic "1" level, output node 56 is forced to a logic "0" level. However, if input node 58 falls from a logic "1" level to a logic "0" level during the evaluate phase, output node 56 rises from a logic "0" level to a logic "1" level. If input node 58 does not transition from a logic "1" level to a logic "0" level during evaluate phase, output node 56 remains at a logic "0" level.

Figure 4:
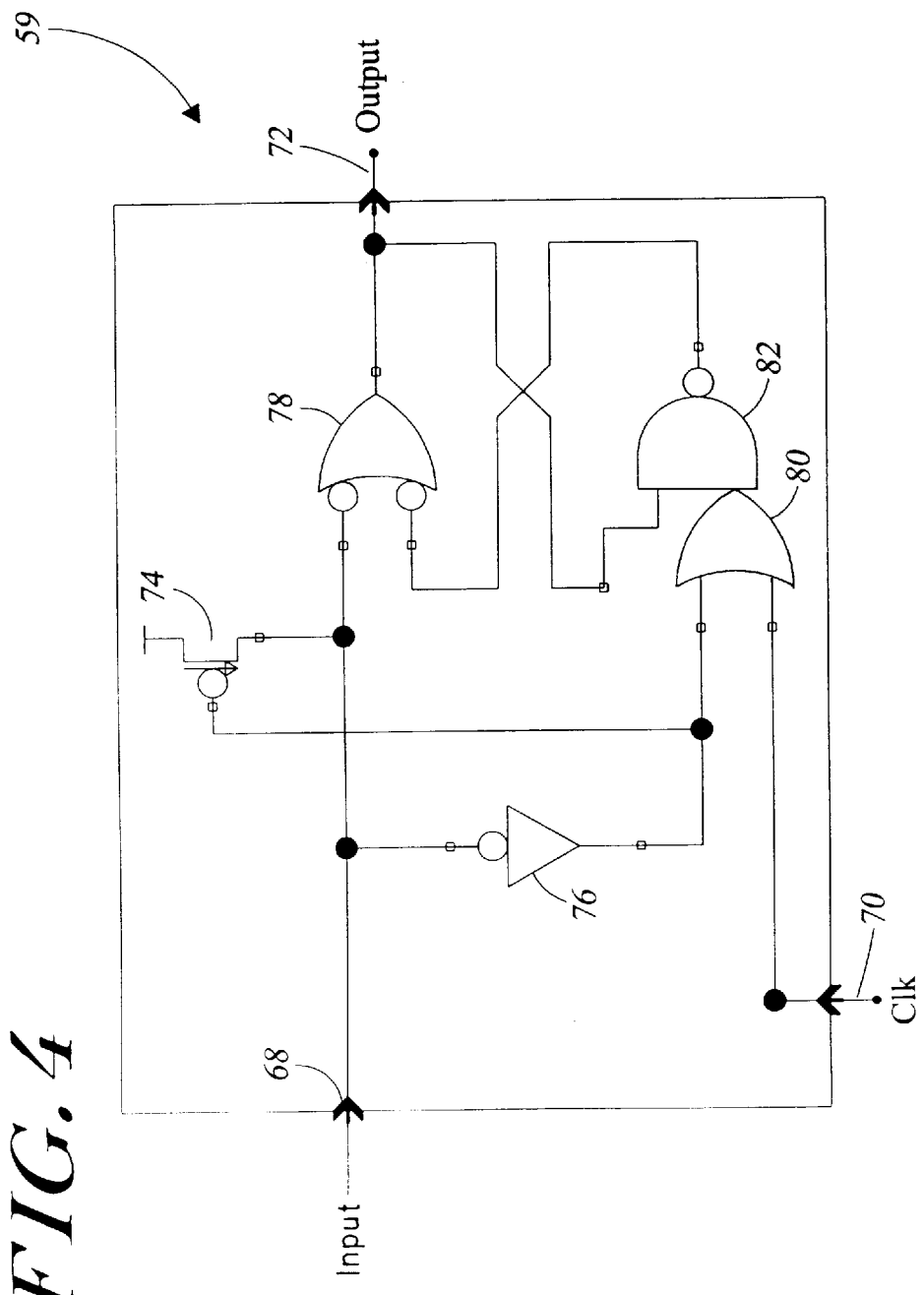
FIG. 4 depicts a B phased dynamic glitch latch in more detail.

FIG. 4 depicts a B phase dynamic glitch latch 59 in more detail. Input node 68 is in circuit with the drain of PMOS transistor 74, a first input of NOR gate 78, and the input of inverter 76. Clock input node 70 is tied to a first input of the NOR gate 80. The output of inverter 76 is coupled to the inverter gate of PMOS transistor 74 and is in circuit the second input of NOR gate 80. The source of PMOS transistor 74 is tied to a voltage source supplying a high level voltage signal. NOR gate 80 has its output in circuit with a first input of NAND gate 82. NAND gate 82 has its output in circuit with a second input of NOR gate 78. NOR gate 78 has its output in circuit with output node 72 and in circuit with a second input of NAND gate 82. One skilled in the art will recognize that the PMOS transistor 74 operates as an optional keeper device and that the circuit configuration depicted by FIG. 4 may be adapted to operate and function without the PMOS transistor 74.

With a B phase dynamic glitch latch, the latch's evaluation phase occurs during the clock's B phase, that is, when the clock pulse is at a logic "0" level. Dynamic glitch latch 59 operates in similar fashion to dynamic glitch latch 57, except that the latch's evaluate phase and memory (latch) phase are opposite. In operation, input node 68 of dynamic glitch latch 59 is precharged to a logic "1" level when the latch is closed or latched, that is, when the clock at input node 70 is at a logic "1" level. Should the output node 72 of dynamic latch 59 be at a logic "1" level at the start of the evaluate phase, that is, when the clock is a logic "0" at input node 70, output node 72 transitions to a logic "0" level. But, if input node 68 transitions from a logic "1" level to a logic "0" level during the evaluate phase, output node 72 will transition to a logic "1" level. Output node 72 remains at a logic "0" level, so long as, input node 68 remains at a logic "1" level.

Figure 5:
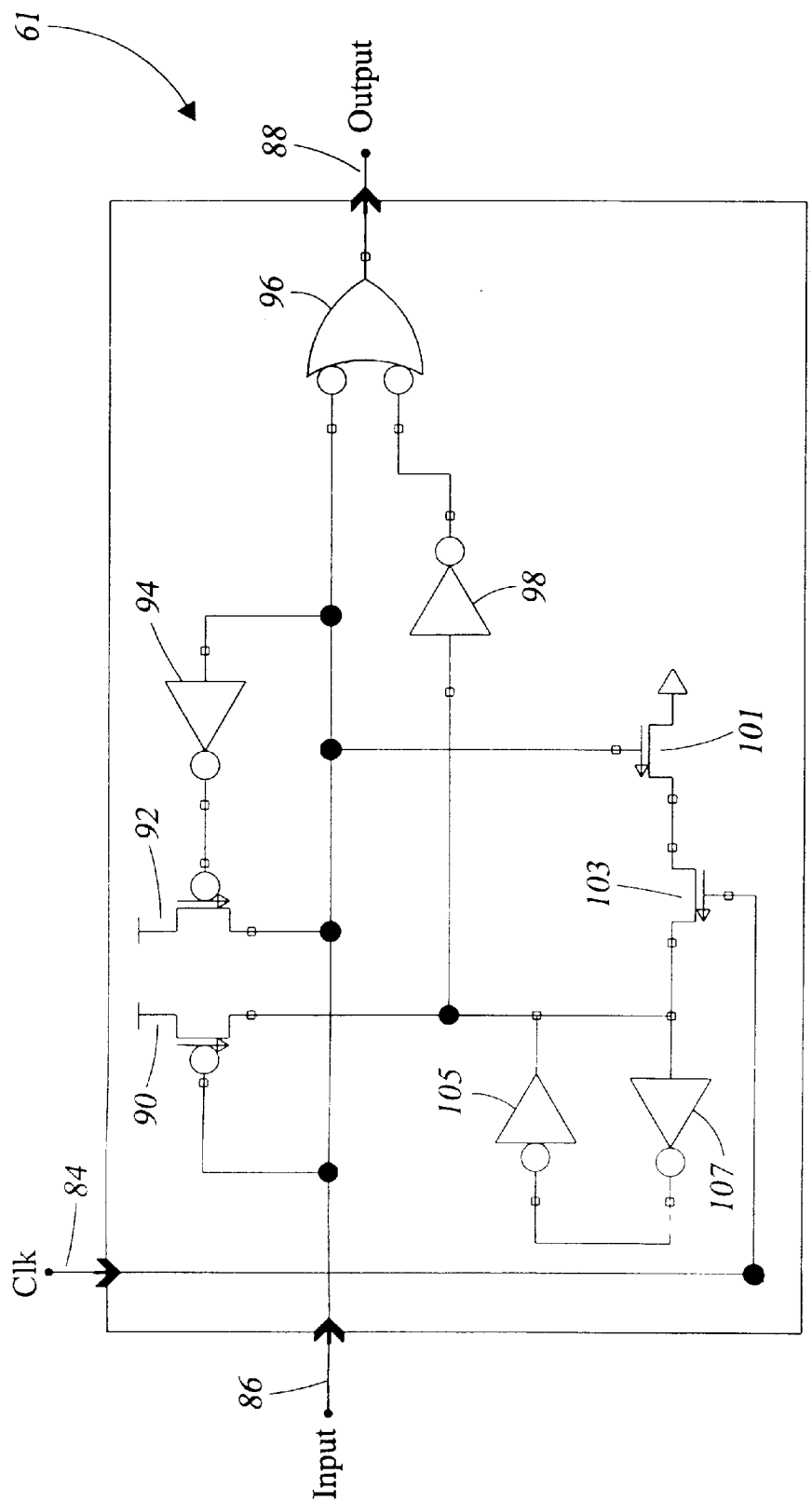
FIG. 5 depicts an A phased dynamic glitch latch in more detail.

FIG. 5 is a more detailed illustration of a dynamic A phase jam latch 61 that is suitable for practice in the illustrative embodiment of the present invention. Dynamic latch 61 evaluates input 86 during the A phase of the clock pulse at input node 84, that is, when the clock pulse at input node 84 is at a logic "1" level. Additionally, input node 86 is precharged to a "1" logic level when dynamic latch 61 is closed or in its memory phase.

Dynamic latch 61 has input node 86 in circuit with the gate of PMOS transistor 90, the drain of PMOS transistor 92, the input of inverter 94, the first input of NOR gate 96, and the gate of NMOS transistor 101. The clock input node 84 is tied to the gate of NMOS transistor 103. PMOS transistor 90 has its source in circuit with a voltage source supplying a high level voltage signal, its drain in circuit with the input of inverter 98, the input of inverter 107, the output of inverter 105, and the drain of NMOS transistor 103. Inverter 107 has its output in circuit with input inverter 105. The configuration of inverter 105 and inverter 107 operate to maintain state at the input of inverter 98 until input node 84 and input node 86 are both at a logic "1" level. Inverter 98 has its output in circuit with the second input of NOR gate 96. NOR gate 96 has its output gate in circuit with output node 88. Further, a keeper circuit adapted to include PMOS transistor 92 and inverter 94, help maintain the state of input node 86. PMOS transistor 92 has its source in circuit with a voltage source supplying a high level voltage signal, its gate in circuit with the output of inverter 94, and its drain in circuit with input node 84. Inverter 94 has its input coupled to input node 86. One skilled in the art will recognize that the keeper circuit that includes PMOS transistor 92 and inverter 94 operates as an optional keeper circuit and that the circuit configuration depicted by FIG. 5 may be adapted to operate and function without the PMOS transistor 92 and inverter 94.

In operation, input node 86 is precharged to a logic "1" level so that when the clock at input node 84 is in its A phase, that is, at a logic "1" level, latch 61 is in the evaluate phase. If output node 88 is at logic "1" level at the start of the evaluate phase, the level at output node 88 falls to a logic "0" level. If input node 86 should transition from a logic "1" level to logic "0" level while the clock at input node 84 is a logic "1" level, output node 88 will rise to a logic "1" level because PMOS transistor 90 is able to pull the input node of inverter 98 to a logic "1" level. If input node 86 does not change state while input node 84 is at logic "1" level, output node 88 remains at a logic "0" level. One skilled in the art will appreciate, that the dynamic A phase jam latch 61 may be modified to operate as a dynamic B phase jam latch, that is, a dynamic jam latch that evaluates when the clock is at a logic "0" level.

While the present invention has been described with reference to a preferred embodiment thereof, one skilled in the art will appreciate that various changes in form and detail may be made without departing from the intended scope of the present invention as defined in the pending claims. For example, the write inhibits signal may be based on positive logic instead of negative logic. Moreover, different varieties of electrical components. may be used to practice the present invention. Thus, bipolar transistors maybe used rather than FETS. Further, the logic "0" levels referred to through this text refer to a voltage level that is approximately zero volts, and the logic "1" levels referred to throughout this text refer to a voltage level that is at least approximately 1.0 volts.

What is claimed is:

1. An addressable storage device for storing data comprising:
    a predecode circuit having an input to receive a control signal, the predecode circuit capable of invalidating a memory operation in response to the control signal before a memory row predecode operation occurs; and
    a memory row decoder driven by the predecode circuit, the memory row decoder generating a memory row address if the predecode circuit performs the memory row predecode operation.

2. The storage device of claim 1, wherein the predecode circuit comprises one or more input circuits having a dynamic latch in circuit with a plurality of serially connected transistors to form a plurality of dynamic input nodes for the predecode circuit.

3. The storage device of claim 2, wherein in each of the input circuits, a first transistor of the plurality of serially connected transistors has its gate in circuit with a control signal that when asserted allows the dynamic latch in circuit with the plurality of serially connected transistors to assert an output, and when the control is deasserted the dynamic latch in circuit with the plurality of serially connected transistors is prevented from asserting an output.

4. The storage device of claim 2, wherein the predecode circuit generates a partial memory row address based on data asserted by the one or more input circuits of the predecode circuit.

5. The storage device of claim 2, wherein the dynamic latch of the one or more input circuits comprises a dynamic glitch latch.

6. The storage device of claim 2, wherein the dynamic latch of the one or more input circuits comprises a dynamic jam latch.

7. In a storage device having addressable rows, a method of invalidating a write operation before a predecode operation occurs, the method, comprising the steps of:
    receiving memory address data at one or more dynamic input nodes of a predecode circuit for a write operation; and deasserting a valid signal at the one or more dynamic input nodes of the predecode circuit, to prevent the received data from being asserted beyond the input nodes of the predecode circuit.

8. The method of claim 7, wherein each of the one or more dynamic input nodes of the predecode circuit comprises a dynamic latch in circuit with a plurality of serially connected transistors.

9. The method of claim 7, further comprising the step of preventing an assertion of a plurality of write lines in the storage device when the valid signal is deasserted at the one or more dynamic input nodes of the predecode circuit.

10. The method of claim 8, wherein the dynamic latch of the one or more dynamic input nodes comprises a dynamic glitch latch.

11. The method of claim 8, wherein the dynamic latch of the one or more dynamic input nodes comprises a dynamic jam latch.

12. The method of claim 7, further comprising the step of generating a valid write row word line when the valid signal is asserted at the one or more dynamic input nodes of the predecode circuit.

13. An apparatus that invalidates a write operation before a predecode operation occurs, comprising:

a predecode circuit having one or more switches in circuit with a control signal to control assertion and deassertion of a plurality of predecode input nodes of the predecode circuit.

14. The apparatus of claim 13, further comprising an output circuit in circuit with the predecode circuit that generates a memory word line when the plurality of predecode input nodes are asserted.

15. The apparatus of claim 13, wherein the predecode circuit further comprises a dynamic input circuit, wherein the dynamic input circuit asserts complementary data in a clock-like manner to the plurality of predecode input nodes when a valid control signal is asserted at one or more input nodes of the dynamic input circuit and wherein the dynamic input circuit deasserts the complementary data when the valid control signal is deasserted at the one or more input nodes of the dynamic input circuit.

16. The apparatus of claim 15, wherein the dynamic input circuit includes a plurality of dynamic input nodes wherein each dynamic node comprises a dynamic latch in circuit with a plurality of serially connected transistors that form one of the plurality of dynamic input nodes of the dynamic input circuit.

17. The apparatus of claim 16, wherein the plurality of serially connected transistors includes a switch to prevent the dynamic latch from asserting a valid output when the control signal is deasserted.

18. The apparatus of claim 16, wherein the dynamic latch comprises dynamic glitch latches.

19. The apparatus of claim 16, wherein the dynamic latch comprises dynamic jam latches.

20. The apparatus of claim 13, wherein the output circuit comprises an AND style row decoder to generate memory word lines.

21. The apparatus of claim 13, wherein the output circuit comprises a NOR style row decoder to generate memory word lines.

* * * * *